(12) United States Patent
Wang et al.

(10) Patent No.: US 12,190,782 B2
(45) Date of Patent: *Jan. 7, 2025

(54) SHIFT REGISTER, GATE DRIVING CIRCUIT AND DISPLAY PANEL FOR PREVENTING CHANNEL SHORT CIRCUIT

(71) Applicants: Beijing BOE Display Technology Co., Ltd., Beijing (CN); BOE TECHNOLOGY GROUP CO., LTD., Beijing (CN)

(72) Inventors: Tingting Wang, Beijing (CN); Qi Wang, Beijing (CN); Yan Yan, Beijing (CN)

(73) Assignees: Beijing BOE Display Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/496,888

(22) Filed: Oct. 29, 2023

(65) Prior Publication Data
US 2024/0054938 A1 Feb. 15, 2024

Related U.S. Application Data

(63) Continuation of application No. 17/764,259, filed as application No. PCT/CN2021/078442 on Mar. 1, 2021, now Pat. No. 11,862,061.

(51) Int. Cl.
*G09G 3/32* (2016.01)
*G09G 3/20* (2006.01)
(Continued)

(52) U.S. Cl.
CPC ........... *G09G 3/2092* (2013.01); *G11C 19/28* (2013.01); *G02F 1/1362* (2013.01);
(Continued)

(58) Field of Classification Search
CPC ......... G09G 3/2092; G09G 2310/0267; G09G 2310/0286; G09G 2330/04; G11C 19/28;
(Continued)

(56) References Cited

U.S. PATENT DOCUMENTS

2016/0118409 A1 4/2016 Jin
2016/0246093 A1 8/2016 Ochiai
(Continued)

FOREIGN PATENT DOCUMENTS

CN 101946327 A 1/2011
CN 102472933 A 5/2012
(Continued)

OTHER PUBLICATIONS

WIPO, International search report issued Dec. 6, 2021 for application No. PCT/CN2021/078442.
(Continued)

*Primary Examiner* — Adam J Snyder
(74) *Attorney, Agent, or Firm* — HOUTTEMAN LAW LLC

(57) ABSTRACT

The present disclosure provides a shift register, a gate driving circuit and a display panel. The shift register includes a transistor, which includes a gate electrode, a gate insulating layer, an active layer, a first electrode and a second electrode; the first and second electrode are of comb-shaped structures; the first electrode includes first and second comb tooth portions arranged at intervals, and a first comb handle portion connecting the first and second comb tooth portions; and comb tooth electrodes of the first comb tooth portions have a different length from those of the second comb tooth portions; the second electrode includes third and fourth comb tooth portions arranged at intervals, and a second comb handle portion connecting the third and fourth comb tooth portions; the first and third comb tooth
(Continued)

portions form an inter-digital structure, the second and fourth comb tooth portions form an inter-digital structure.

20 Claims, 6 Drawing Sheets

(51) Int. Cl.
*G11C 19/28* (2006.01)
*G02F 1/1362* (2006.01)
*H01L 27/12* (2006.01)
*H01L 29/417* (2006.01)

(52) U.S. Cl.
CPC ............ *G09G 2310/0267* (2013.01); *G09G 2310/0286* (2013.01); *G09G 2330/04* (2013.01); *H01L 27/124* (2013.01); *H01L 29/41733* (2013.01)

(58) Field of Classification Search
CPC  G02F 1/1362; H01L 27/124; H01L 29/41733
See application file for complete search history.

(56) References Cited

U.S. PATENT DOCUMENTS

| 2016/0358573 | A1 | 12/2016 | Takeuchi |
| 2016/0372487 | A1* | 12/2016 | Wang .................... H01L 27/124 |
| 2019/0206502 | A1 | 7/2019 | Lim |

FOREIGN PATENT DOCUMENTS

| CN | 105047125 A | 11/2015 |
| CN | 105405852 A | 3/2016 |
| CN | 106816141 A | 6/2017 |
| CN | 109309100 A | 2/2019 |
| CN | 111540313 A | 8/2020 |
| CN | 111640747 A | 9/2020 |
| CN | 112130386 A | * 12/2020 | ........... G02F 1/1362 |

OTHER PUBLICATIONS

USPTO, First Office Action issued Apr. 20, 2023 for U.S. Appl. No. 17/764,259.

USPTO, Notice of Allowance issued Aug. 16, 2023 for U.S. Appl. No. 17/764,259.

* cited by examiner

SHIFT REGISTER, GATE DRIVING CIRCUIT AND DISPLAY PANEL FOR PREVENTING CHANNEL SHORT CIRCUIT

This is a continuation application of U.S. patent application Ser. No. 17/764,259, filed on Mar. 28, 2022, a National Phase Application filed under 35 U.S.C. 371 as a national stage of PCT/CN2021/078442 filed on Mar. 1, 2021, the content of each of which is hereby incorporated by reference in its entirety.

TECHNICAL FIELD

Embodiments of present disclosure relate to the field of display technology, and in particular to a shift register, a gate driving circuit and a display panel.

BACKGROUND

The Gate Driver on Array (GOA) technology may integrate a gate driving circuit on an array substrate of a display panel to replace a driving chip made of an external silicon wafer, so that a gate integrated circuit and a fan-out wiring space may be omitted, simplifying the structure of a display product, and reducing the frame of the display product.

SUMMARY

An embodiment of the present disclosure provides a shift register, a gate driving circuit and a display panel.

In a first aspect, the embodiment of the present disclosure provides a shift register, including: a transistor;
wherein the transistor includes a gate electrode, a gate insulating layer, an active layer, a first electrode and a second electrode; the first electrode and the second electrode are of comb-shaped structures;
the first electrode includes first comb tooth portions and second comb tooth portions arranged at intervals, and a first comb handle portion connecting the first comb tooth portions and the second comb tooth portions; and comb tooth electrodes of the first comb tooth portions have a different length from that of comb tooth electrodes of the second comb tooth portion;
the second electrode includes third comb tooth portions and fourth comb tooth portions arranged at intervals, and a second comb handle portion connecting the third comb tooth portions and the fourth comb tooth portions;
the first comb tooth portions and the third comb tooth portions form an inter-digital structure, the second comb tooth portions and the fourth comb tooth portions form an inter-digital structure, and orthographic projections of the first comb tooth portions, the third comb tooth portions, the second comb tooth portions and the fourth comb tooth portions on the active layer are not overlapped with each other; and
orthographic projections of the first comb tooth portions, the second comb tooth portions, the first comb handle portion and the second comb handle portion on the active layer defines a short circuit prevention region for preventing a short circuit between the first electrode and the second electrode from occurring.

In some embodiments, a length of each of the comb tooth electrodes of the first comb tooth portions is greater than that of the second comb tooth portions; and a length of each of comb tooth electrodes of the third comb tooth portions is greater than that of the fourth comb tooth portions.

In some embodiments, the first comb tooth portions include a plurality of comb tooth electrodes arranged in parallel and at equal intervals;
the second comb tooth portions include a plurality of comb tooth electrodes arranged in parallel and at equal intervals;
the third comb tooth portions include a plurality of comb tooth electrodes arranged in parallel and at equal intervals; and
the fourth comb tooth portions include a plurality of comb tooth electrodes arranged in parallel and at equal intervals.

In some embodiments, the first comb tooth portions and the third comb tooth portions are staggered to form a first portion having an inter-digital structure, and
the second comb tooth portions and the fourth comb tooth portions are staggered to form a second portion having an inter-digital structure.

In some embodiments, in the first portion, a gap between the comb tooth electrodes of the first comb tooth portion and the third comb tooth portion adjacent to each other is a first gap; and
in the second portion, a gap between the comb tooth electrodes of the second comb tooth portion and the fourth comb tooth portion adjacent to each other is a second gap.

In some embodiments, in the short circuit prevention region, the first comb tooth portion and the second comb tooth portion are arranged in parallel, and a gap between the first comb tooth portion and the second comb tooth portion is a third gap; and
the third gap is greater than the first gap, and the third gap is greater than the second gap.

In some embodiments, the third gap is greater than or equal to 6 μm.

In some embodiments, an orthogonal projection of a part of the first comb handle portion in the short circuit prevention region on the active layer is a diagonal line.

In some embodiments, the first comb tooth portion and the second comb tooth portion in the short circuit prevention region are adjacent to each other, and
a gap between the first comb tooth portion and the second comb tooth portion in the short circuit prevention region is the first gap or the second gap.

In some embodiments, an orthographic projection of a part of the first comb handle portion in the short circuit prevention region on the active layer is an arc.

In some embodiments, the second electrode further includes a fifth comb tooth portion connected to the second comb handle portion; the fifth comb tooth portion is in the short circuit prevention region and is on a central line, parallel to the first comb tooth portion and the second comb tooth portion, of a spacing region between the first comb tooth portion and the second comb tooth portion in the short circuit prevention region;
a gap between the fifth comb tooth portion and the first comb handle portion in the short circuit prevention region is a fourth gap; and
the fourth gap is greater than the first gap, and the fourth gap is greater than the second gap.

In some embodiments, the first gap is equal to the second gap.

In some embodiments, the first comb handle portion is connected to any two adjacent comb tooth electrodes in the first comb tooth portions to form a U-shaped unit, the first comb handle portion is connected to any two adjacent electrodes in the second comb tooth portions to form a U-shaped unit, and the first electrode includes a plurality of the U-shaped units connected in series.

In some embodiments, the second comb handle portion is connected to any two adjacent electrodes in the third comb tooth portions to form a U-shaped unit, the second comb handle portion is connected to any two adjacent electrodes in the fourth comb tooth portions to form a U-shaped unit, and the second electrode includes a plurality of the U-shaped units connected in series.

In some embodiments, the gate electrode is below the active layer; or the gate electrode is above the active layer.

In some embodiments, the first electrode is a source electrode, and the second electrode is a drain electrode; or the first electrode is a drain electrode and the second electrode is a source electrode.

In some embodiments, the transistor includes one or a plurality of transistors;

the shift register further includes a first combination including two transistors in the plurality of transistors, wherein in the first combination, the gate electrodes of the two transistors are connected with each other, the first electrodes of the two transistors are connected with each other and the second electrodes of the two transistors are connected with each other; and the two transistors in the first combination are arranged to be axisymmetric to each other.

In a second aspect, an embodiment of the present disclosure provides a gate driving circuit, which includes a plurality of the shift registers described above; and the plurality of the shift registers are cascaded.

In a third aspect, an embodiment of the present disclosure provides a display panel including the gate driving circuit described above.

In some embodiments, the display panel further includes an array substrate, wherein the array substrate includes a display region and a frame region, and the frame region surrounds a periphery of the display region; and the gate driving circuit is on the array substrate in the frame region at two opposite sides of the display region, respectively.

BRIEF DESCRIPTION OF DRAWINGS

The accompanying drawings are included to provide a further understanding of the embodiments of the present disclosure, and constitute a part of this specification, illustrate the present disclosure together with embodiments of the present disclosure and do not limit the present disclosure. The above and other features and advantages will become more apparent to one of ordinary skill in the art by describing in detail exemplary embodiments thereof with reference to the drawings, in which.

Figure 1:
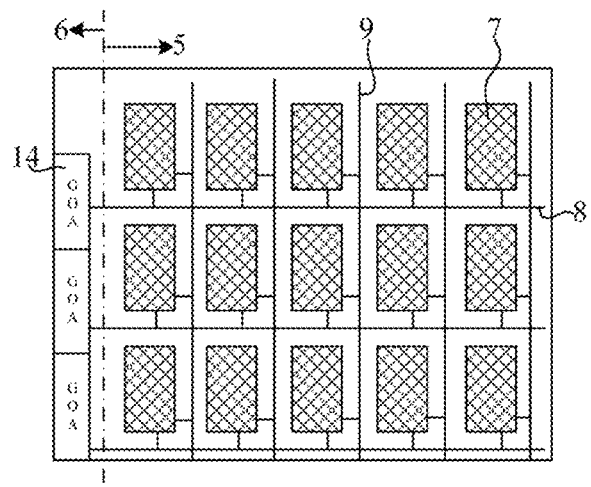
FIG. 1 is a schematic top view of a distribution of gate driving circuits in a display panel.

The reference numbers are:

1. a transistor; 10. a U-shaped unit; 100. a channel; 101. a gate electrode; 102. a gate insulating layer; 103. an active layer; 104. a first electrode; 105. a second electrode; 11. a first portion; 12. a second portion; 141. a first comb handle portion; 142. a first comb tooth portion; 143. a second comb tooth portion; 151. a second comb handle portion; 152. a third comb tooth portion; 153. a fourth comb tooth portion; 154. a fifth comb tooth portion; 13. a dummy U-shaped unit; 2. a first combination; 3. a second transistor; 4. a second combination; 106. an opening; 108. a source electrode; 109. a drain electrode; 110. a passivation layer; 5. a display region; 6. a frame region; 7. a pixel unit; 8. a gate line; 9. a data line; 14. a shift register; 15. a thin film transistor; 16. a transistor.

DETAIL DESCRIPTION OF EMBODIMENTS

In order to enable one of ordinary skill in the art to better understand the technical solutions of the embodiments of the present disclosure, a shift register, a gate driving circuit, and a display panel provided in the embodiments of the present disclosure will be described in further detail with reference to the accompanying drawings and the detailed description.

The embodiments of the present disclosure will be described more fully hereinafter with reference to the accompanying drawings, but the embodiments shown may be embodied in different forms and should not be construed as limited to the embodiments set forth herein. Rather, these embodiments are provided so that this disclosure will be thorough and complete, and will fully convey the scope of the present disclosure to one of ordinary skill in the art.

The embodiments of the present disclosure are not limited to the embodiments shown in the drawings, but include modifications of configurations formed based on a manufacturing process. Thus, regions illustrated in the figures have schematic properties, and shapes of the regions shown in the figures illustrate specific shapes of the regions, but are not intended to be limiting.

In the related art, referring to FIG. 1, a display panel generally has a display region 5 and a frame region 6 surrounding the display region 5; a plurality of pixel units 7 arranged in an array are disposed in the display region 5, and a pixel circuit is disposed in each pixel unit 7; the pixel units 7 in a same row are connected to a same gate line 8, and the pixel units 7 in a same column are connected to a same data line 9. A gate driving circuit is disposed in the frame region 6, and includes a plurality of cascaded shift registers (GOAs, Gate on Array) 14, where the shift registers 14 are disposed in a one-to-one correspondence with the gate lines 8, that is, each shift register 14 is connected to one gate line 8. When each frame of picture is displayed, the plurality of cascaded shift registers 14 output stage-by-stage a gate scanning signal to the corresponding gate lines 8, so as to complete the row-by-row scanning of the pixel circuits; and each data line 9 writes a data voltage signal into pixel circuits in a corresponding row while each gate line 8 is scanned, so as to light the pixel units 7 in the row.

Figure 2:
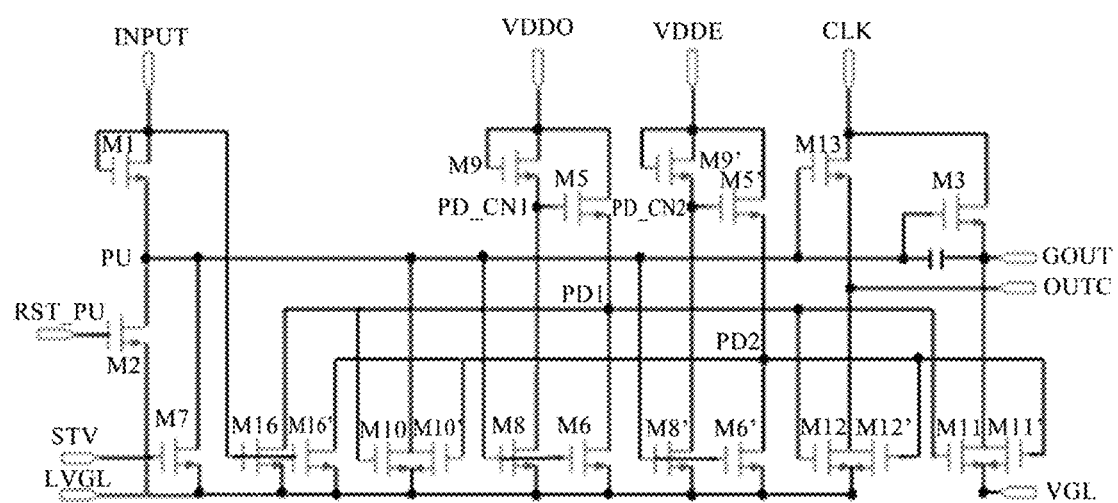
FIG. 2 is a circuit diagram of a shift register of a 21T1C circuit configuration.
Figure 3:
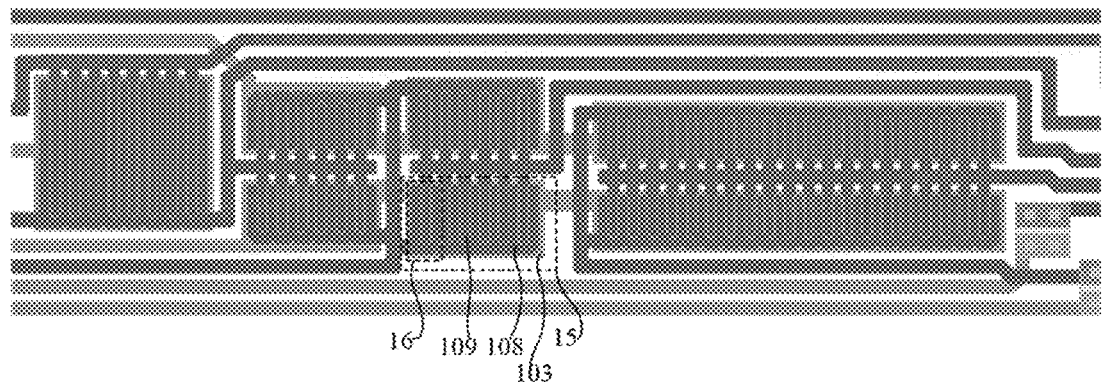
FIG. 3 is a partial layout of a shift register in which transistors have a same size.

Referring to FIGS. 2 and 3, the shift register (GOA) is a gate driving circuit formed by a plurality of thin film transistors 15 and a capacitor and the like. In the shift register, most of the thin film transistors 15 each are formed by a plurality of transistors 16, which are electrically connected to each other, each having a smaller size and having a common gate electrode (gate electrodes of the transistors 16 are connected together), a common source electrode (source electrodes 108 of the transistors 16 are connected together), and a common drain electrode (drain electrodes 109 of the transistors 16 are connected together), respectively, and the active layers of these transistors 16 having the smaller size are formed by a whole piece of film layer to meet the requirement of a channel length designed for each thin film transistor 15. When a width of the frame region is sufficient, the smaller transistors 16 of the thin film transistor 15 are mostly of one size type. Referring to FIG. 3, the sizes of the smaller transistors 16 of the thin film transistor 15 are uniform (same). However, in recent years, in order to improve the performance of the display product, most customers require that the display product (such as an MNT display product, i.e. a display product having a size of 18.5 to 34 inches) has an ultra-narrow frame, that is, a display region of the display product is as large as possible enough to satisfy the visual enjoyment of the customers in the viewing.

Figure 4:
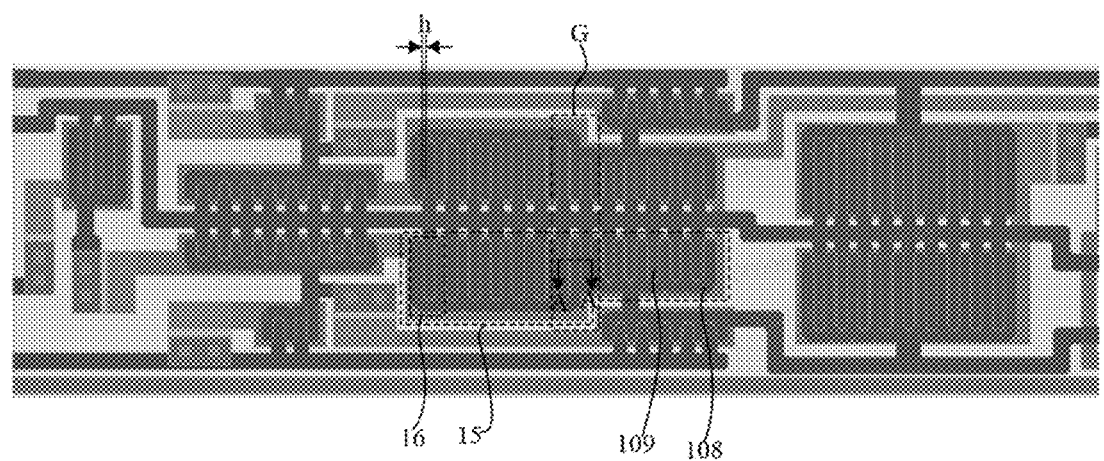
FIG. 4 is a partial layout of a shift register in which one transistor has a different size.

When the display product is designed with an ultra-narrow frame, in order to satisfy the requirements that the display product is properly driven, the thin film transistors 15 in the shift register must be provided within a frame with a limited width, so that some thin film transistors 15 each are usually designed to include smaller transistors 16 having different sizes, as shown in FIG. 4.

Figure 5:
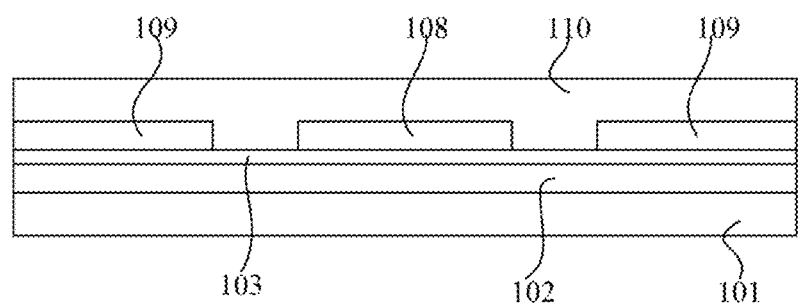
FIG. 5 is a cross-sectional view of a structure taken along a line AA in FIG. 4.
Figure 6:
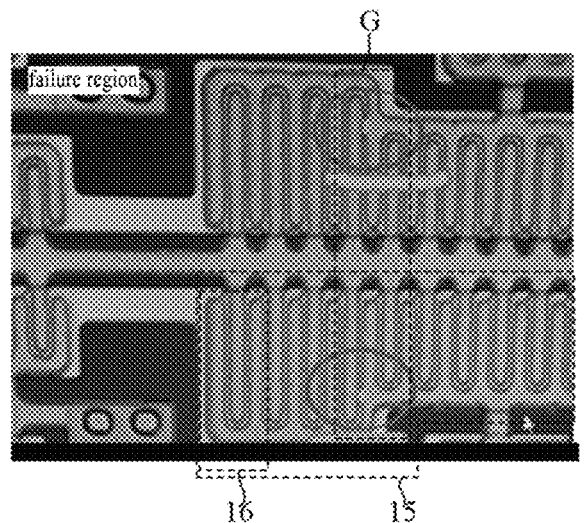
FIG. 6 is a schematic diagram of a transistor with a channel short circuit occurring in a transition region in FIG. 4.

Referring to FIGS. 5 and 6, in a thin film transistor 15, in a transition region G where the transistors 16 of different sizes are provided, on one hand, a size of the transition region G where the transistors 16 of different sizes are distributed is different from both a size of a larger region where the transistors having a larger size are distributed and a size of a smaller region where the transistors having a smaller size are distributed, i.e. the transition region G is an irregular region compared with the larger region and the smaller region; on the other hand, the channel length h (i.e., a width of a gap between the source electrode 108 and the drain electrode 109 of the transistor directly facing to each other) of each of all the transistors 16 having different sizes forming the thin film transistor 15 is constant, and is about 3.5 μm; therefore, when patterns of the source and drain electrodes of the transistors 16 having different sizes are formed on a pattern of the active layer 103 by a conventional patterning process, a photoresist (such as a PR photoresist) is easily accumulated in channels of the transistors 16 having different sizes in the transition region G, so that parts of the source and drain electrode film layer within the channels, which should not be protected by the photoresist, are covered and protected by the photoresist, and the parts of the source and drain electrode film layer within the channels are remained in the etching process, which causes a short circuit (also called a channel short circuit) between the source electrode 108 and the drain electrode 109 of each of the transistors 16 having different sizes in the transition region G, and thus causes an abnormal signal output of the shift register, and causes defects such as horizontal striations and the like when the display product is displaying.

In order to solve the problems such as the above channel short circuit of the shift register, the embodiment of the present disclosure provides the following technical solution.

Figure 7:
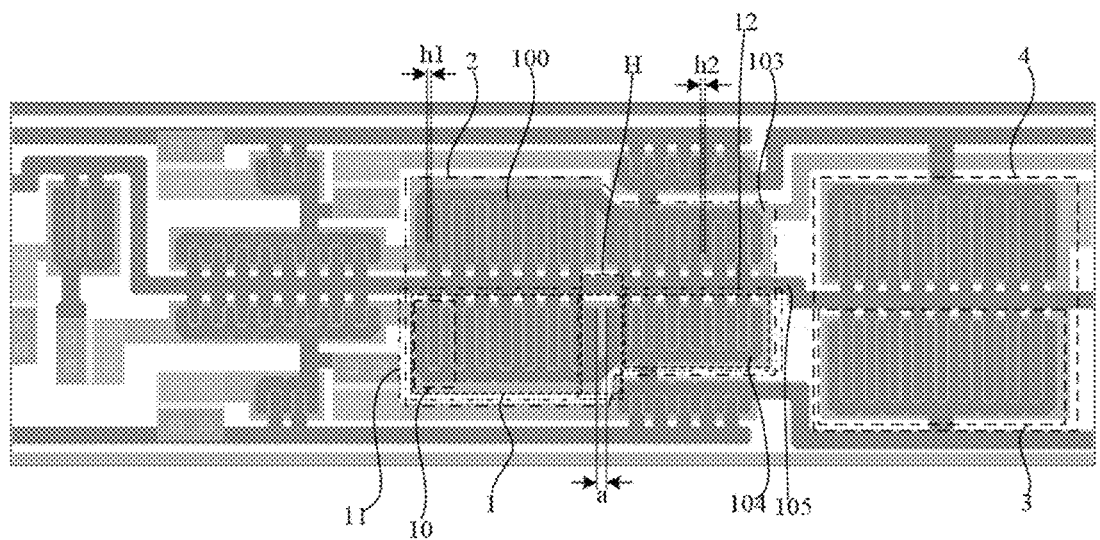
FIG. 7 is a partial layout of a shift register in an embodiment of the present disclosure.
Figure 8:
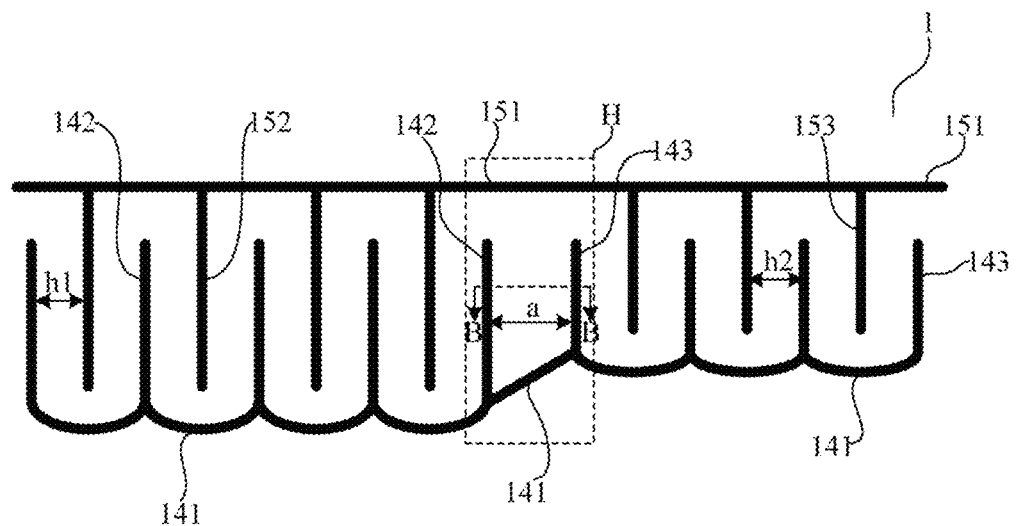
FIG. 8 is a schematic top view of a structure of a transistor in the shift register of FIG. 7.
Figure 9:
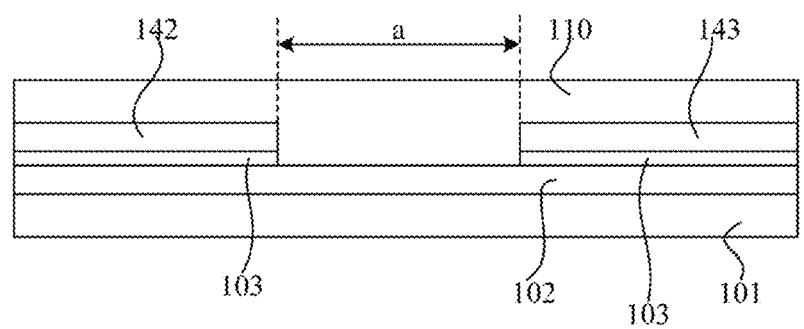
FIG. 9 is a cross-sectional view of a structure taken along a line BB in FIG. 8.

In a first aspect, an embodiment of the present disclosure provides a shift register, referring to FIGS. 7 to 9, including: a transistor 1; the transistor 1 includes a gate electrode 101, a gate insulating layer 102, an active layer 103, a first electrode 104, and a second electrode 105; the first electrode 104 and the second electrode 105 are comb-shaped; the first electrode 104 includes first comb tooth portions 142 and second comb tooth portions 143 arranged at intervals, and a first comb handle portion 141 connecting the first comb tooth portions 142 and the second comb tooth portions 143, and comb tooth electrodes of the first comb tooth portion 142 and the second comb tooth portion 143 are different in length; the second electrode 105 includes third comb tooth portions 152 and fourth comb tooth portions 153 arranged at intervals, and a second comb handle portion 151 connecting the third comb tooth portions 152 and the fourth comb tooth portions 153; the first comb tooth portions 142 and the third comb tooth portions 152 form an inter-digital structure, the second comb tooth portions 143 and the fourth comb tooth portions 153 form an inter-digital structure, and orthographic projections of the first comb tooth portions 142, the third comb tooth portions 152, the second comb tooth portions 143 and the fourth comb tooth portions 153 on the active layer 103 are not overlapped with each other; orthographic projections of one first comb tooth portion 142 of the first comb tooth portions 142, one second comb tooth portion 143 of the second comb tooth portions 143, the first comb handle portion 141 and the second comb handle portion 151 on the active layer 103 defines (encloses) a short circuit prevention region H for preventing a short circuit between the first electrode 104 and the second electrode 105.

A part of the active layer 103 in a gap between the first comb tooth portion 142 and the third comb tooth portion 152 directly facing to each other, and a part of the active layer 103 in a gap between the second comb tooth portion 143 and the fourth comb tooth portion 153 directly facing to each other, form a part of the channel 100 of the transistor 1. When a turn-on voltage is input to the gate electrode 101 of the transistor 1, a conduction between the first electrode 104 and the second electrode 105 of the transistor 1 is enabled, and the current flows from the first electrode 104 to the second electrode 105 through the channel 100 of the transistor 1, or the current flows from the second electrode 105 to the first electrode 104 through the channel 100 of the transistor 1, so that the transistor 1 is turned on.

In some embodiments, the gate electrode 101 is located below the active layer 103, i.e. the transistor 1 is a bottom gate type transistor. In some embodiments, the gate electrode 101 is located above the active layer 103, i.e. the transistor 1 is a top gate type transistor. In this embodiment, by taking a bottom gate type transistor as an example, the transistor 1 further includes a passivation layer 110 disposed on a side of the first electrode 104 and the second electrode 105 away from the active layer 103. Forming the transistor 1 includes sequentially forming patterns of the gate electrode 101, the gate insulating layer 102, and the active layer 103, then forming patterns of the first electrode 104 and the second electrode 105 on the pattern of the active layer 103, and finally forming the passivation layer 110 on the first electrode 104 and the second electrode 105. The patterns of the gate electrode 101, the active layer 103, the first electrode 104 and the second electrode 105 are formed by conventional patterning processes (including film formation, photoresist coating, exposure, development, etching, etc.).

By defining the short circuit prevention region by the orthographic projections of the one first comb tooth portion 142 and the one second comb tooth portion 143 of different lengths and the first comb handle portion 141 and the second comb handle portion 151 on the active layer 103, patterns of the first and second comb tooth portions 142 and 143 of the first electrode 104 having different lengths and the third and fourth comb tooth portions 152 and 153 of the second electrode 105 having different lengths are formed on the active layer 103 through a conventional patterning process, such that it is possible to prevent the photoresist from accumulating in the channel 100 formed between the comb tooth portions of the transistor 1 having different lengths, thereby preventing parts of the film layer forming the patterns of the first and second electrodes 104 and 105 within the channel 100 from remaining during the etching process, and further, it is possible to avoid the short circuit between the first electrode 104 and the second electrode 105 in the channel 100 from occurring (that is, preventing the channel short circuit from occurring), and finally, it is ensured that the signal output of the shift register is normal, and the defects of horizontal striations and the like of a display product adopting the shift register during displaying are eliminated.

In some embodiments, the length of the comb tooth electrode of the first comb tooth portion 142 is greater than that of the second comb tooth portion 143; the length of the comb tooth electrode of the third comb tooth portion 152 is greater than that of the fourth comb tooth portion 153.

In some embodiments, the first comb tooth portions 142 include a plurality of comb tooth electrodes arranged in parallel and at equal intervals; the second comb tooth portions 143 include a plurality of comb tooth electrodes arranged in parallel and at equal intervals; the third comb tooth portions 152 include a plurality of comb tooth electrodes arranged in parallel and at equal intervals; the fourth comb tooth portions 153 include a plurality of comb tooth electrodes arranged in parallel and at equal intervals.

In some embodiments, the first comb tooth portions 142 and the third comb tooth portions 152 are staggered to form a first portion 11 having an inter-digital structure, and the second comb tooth portions 143 and the fourth comb tooth portions 153 are staggered to form a second portion 12 having an inter-digital structure.

In some embodiments, in the first portion 11, a gap between the comb tooth electrodes of the first comb tooth portion 142 and the third comb tooth portion 152 adjacent to each other is a first gap h1; in the second portion 12, a gap between the comb tooth electrodes of the second comb tooth portion 143 and the fourth comb tooth portion 153 adjacent to each other is a second gap h2. The first gap h1 is a length of the channel 100 formed between the first comb tooth portion 142 and the third comb tooth portion 152 each having a greater length. The second gap h2 is a width of the channel 100 formed between the second comb tooth portion 143 and the fourth comb tooth portion 153 each having a smaller length.

In some embodiments, the first gap h1 is equal to the second spacing h2, i.e., the width of the channel 100 formed between the comb tooth portions each having a greater length is the same as that of the channel 100 formed between the comb tooth portions each having a smaller length. In some embodiments, the first gap h1 and the second gap h2 are both 3.5 µm.

In some embodiments, the first gap h1 may not be equal to the second gap h2. That is, the width of the channel 100 formed between the comb tooth portions each having a greater length is different from that of the channel 100 formed between the comb tooth portions each having a smaller length.

In some embodiments, in the short circuit prevention region H, the first comb tooth portions 142 and the second comb tooth portions 143 are arranged in parallel, and a gap between the first comb tooth portion 142 and the second comb tooth portion 143 is a third gap a; the third gap a is greater than the first gap h1, and the third gap a is greater than the second gap h2.

By providing the third gap a having a width greater than the channel width in the short circuit prevention region H, patterns of the first and second comb tooth portions 142 and 143 and the third and fourth comb tooth portions 152 and 153 having different comb tooth lengths are formed on the active layer 103 through a conventional patterning process, such that it is possible to prevent the photoresist from accumulating and remaining in the third gap a, thereby preventing parts of the film layer forming the patterns of the first and second electrodes 104 and 105 within the third gap a from remaining therein during the etching process, and further, it is possible to prevent the short circuit between the first electrode 104 and the second electrode 105 from occurring in the third gap a (that is, the channel short circuit), and finally, it is ensured that the signal output of the shift register is normal, and the defects of horizontal striations and the like of a display product having the shift register during displaying are avoided.

In some embodiments, the third gap a has a width greater than or equal to 6 µm. In some embodiments, a pattern of the third gap a on a mask forming a pattern of the third gap a has a width of 6 µm. In this way, on one hand, the minimum manufacturing process precision requirement for the third gap a may be met; on the other hand, the third gap a does not greatly increase a space occupied by the transistor 1, so that the display panel adopting the shift register may be ensured to realize a narrow frame; further, it may be ensured that the first electrode 104 and the second electrode 105 will not generate channel short circuit in the short circuit prevention region H, thereby ensuring that the signal output of the shift register is normal, and the defects of horizontal striations and the like of a display product adopting the shift register during displaying are avoided.

In some embodiments, the pattern of the third gap a has a width of 6 µm or more under current manufacturing process conditions. In some embodiments, the third gap a has a width of 10 µm.

In some embodiments, the orthogonal projection of a part of the first comb handle portion 141 in the short circuit prevention region H on the active layer 103 is a diagonal line, which may be formed by using a conventional patterning process.

In some embodiments, the active layer 103 is broken at the third gap a. Since the width of the third gap a may be realized under the current manufacturing process conditions, when the active layer 103 is manufactured, the active layer 103 may be disconnected at the third gap a by using a conventional patterning process (including film formation, photoresist coating, exposure, development, etching, and the like), so that the active layer 103 may be patterned; further, the active layer 103 is disconnected at the third gap a, which further avoid a short circuit between the first electrode 104 and the second electrode 105 near the third gap a.

In some embodiments, the active layers 103 of the first portion 11 of the inter-digital structure are integrally connected (have a one-piece structure), and the active layers 103 of the second portion 12 are integrally connected. In some embodiments, the gate electrodes 101 of the first and second portions 11 and 12 of the inter-digital structure are integrally connected, i.e. the gate electrode 101 of the transistor 1 is designed as a whole piece of conductive film layer. With the arrangement, not only the transistor 1 with the parameters for setting performances may be better realized, but also a narrow frame or an ultra-narrow frame of a display product adopting the shift register may be better realized.

In some embodiments, the first comb handle portion 141 is connected to any two adjacent comb tooth electrodes in the first comb tooth portion 142 to form a U-shaped unit 10, the first comb handle portion 141 is connected to any two adjacent comb tooth electrodes in the second comb tooth portion 143 to form a U-shaped unit 10, and the first electrode 104 includes a plurality of U-shaped units 10 connected in series.

In some embodiments, the second comb handle portion 151 is connected to any two adjacent comb tooth electrodes in the third comb tooth portion 152 to form a U-shaped unit 10, the second comb handle portion 151 is connected to any adjacent two comb tooth electrodes in the fourth comb tooth portion 153 to form a U-shaped unit 10, and the second electrode 105 includes a plurality of U-shaped units 10 connected in series. In this way, an area occupied by the transistor 1 is reduced, thereby reducing an area occupied by the shift register, and further reducing the frame width of the display product adopting the shift register, and thus, realizing a narrow frame or an ultra-narrow frame.

In some embodiments, the first electrode 104 is a source electrode and the second electrode 105 is a drain electrode. In some embodiments, the first electrode may be a drain electrode, and the second electrode may be a source electrode.

In some embodiments, there is at least one transistor 1 in the shift register, i.e. one or a plurality of transistors 1; there is at least one first combination 2 composed of two transistors 1 of the plurality of transistors 1, in the first combination 2, the gate electrodes 101 of the transistors 1 are connected with each other, the first electrodes 104 of the transistors 1 are connected with each other or the second electrodes 105 of the transistors 1 are connected with each other; the two transistors 1 in the first combination 2 are arranged to be axisymmetric to each other. In the present embodiment, the transistor 1 includes one transistor 1. In this way, an area occupied by the transistor 1 is reduced, thereby reducing an area occupied by the shift register, and further reducing the frame width of the display product adopting the shift register, and thus, realizing a narrow frame or an ultra-narrow frame.

In some embodiments, the shift register further includes one or more second transistors 3; the second transistor 3 includes a gate electrode, a gate insulating layer, an active layer, a source electrode and a drain electrode; the source electrodes and the drain electrodes are comb-shaped and have the same size and shape; the source electrodes and the drain electrodes form an inter-digital structure. With the arrangement, not only the second transistor 3 with the parameters for setting performances may be better realized, but also a narrow frame or an ultra-narrow frame of a display product adopting the shift register may be better realized.

In some embodiments, there is at least one second combination 4 composed of two second transistors 3 of the plurality of second transistors 3; in the second combination 4, the gate electrodes of the second transistors 3 are connected with each other, the source electrodes of the second transistors 3 are connected with each other or the drain electrodes of the second transistors 3 are connected with each other; the two second transistors 3 in the second combination 4 are arranged to be axisymmetric to each other. In the present embodiment, one or more second transistors 3 include the plurality of second transistors 3. In this way, an area occupied by the second transistors 3 is reduced, thereby reducing an area occupied by the shift register, and further reducing the frame width of the display product with the shift register, and realizing a narrow frame or an ultra-narrow frame.

Referring to FIG. 2, the shift register is designed in a 21T1C circuit configuration. Transistors M6 and M6' each have the structure of the transistor 1 in this embodiment, and form the first combination 2, and the transistors M6 and M6' are arranged to be axisymmetric to each other. The transistor M6 has the function of controlling (pulling down) a potential at a point PD1 in the shift register; the transistor M6' has the function of controlling (pulling down) a potential at a point PD2 in the shift register. In the 21T1C circuit of the shift register, transistors M5, M6, M6', and M5' are sequentially arranged along a width direction of a frame of a display screen (i.e., a direction of the frame of the display screen away from the display region); the transistors M5 and M5' have the structure of the second transistor 3 in this embodiment. Lengths of the comb tooth portions of the first electrodes in the transistors M6 and M6' are the same, and lengths of the comb tooth portions of the second electrodes in the transistors M6 and M6' are the same, so that a width of the frame of the display screen at positions where the transistors M5, M6, M6', and M5' are arranged is greater. However, the transistors M6 and M6' are designed as having the structure of the transistor 1 in this embodiment, the width of the frame of the display screen at positions where the transistors M5, M6, M6', and M5' are arranged is greatly reduced, thereby realizing a narrow frame of the display screen.

Referring to FIG. 2, widths of the channels of the transistors M6 and M6' are the same, 800 μm respectively, and widths of the channels of the transistors M5 and M5' are the same, 100 μm respectively. In this embodiment, in order to realize a narrow frame or an ultra-narrow frame of the display screen using the shift register, a transistor having a channel width of 600 micrometers or more may be designed as the structure of the transistor 1. The channel width of the transistor refers to a length of a part of the active layer, whose orthographic projection is located in the gap between the source electrode and the drain electrode directly facing to each other, extending along an extending direction of the gap.

The manufacturing of the shift register adopts a conventional manufacturing process, such as a patterning process, which will not be described herein again.

Figure 10:
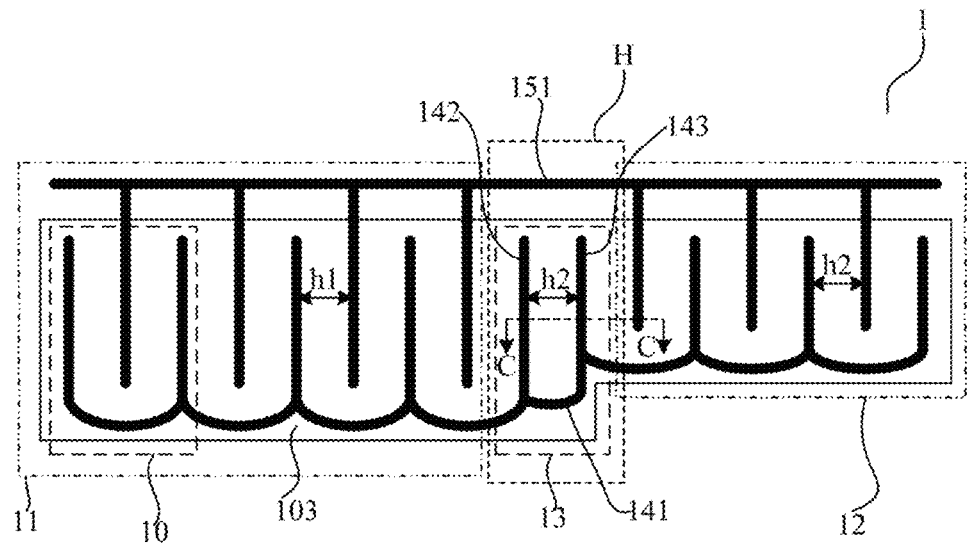
FIG. 10 is a schematic top view of another structure of a transistor in a shift register in an embodiment of the present disclosure.
Figure 11:
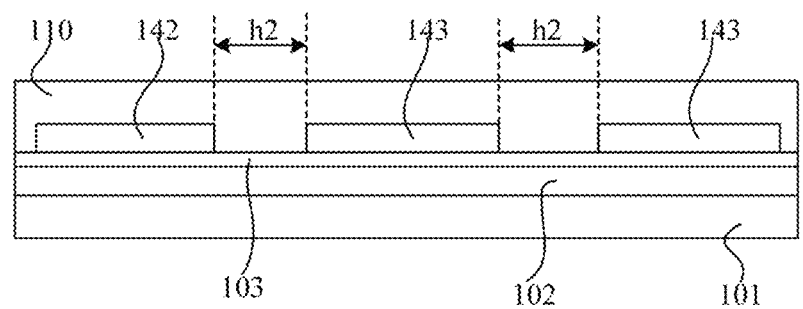
FIG. 11 is a cross-sectional view of a structure taken along a line CC in FIG. 10.

The embodiment of the present disclosure also provides a shift register which is different from the above embodiment in that, referring to FIGS. 10 and 11, in the short circuit prevention region H, the first comb tooth portion 142 is adjacent to the second comb tooth portion 143, and the first gap h1 or the second gap h2 is provided between the first comb tooth portion 142 and the second comb tooth portion 143, that is, a value of the third gap a is a channel length of the first portion 11 or a channel length of the second portion 12.

In the short circuit prevention region H, comb tooth electrodes of the second electrode 105 is not provided between the first comb tooth portion 142 and the second comb tooth portion 143, which is equivalent to providing a dummy U-shaped unit 13 not including the second electrode in the short circuit prevention region H, and the dummy U-shaped unit 13 does not function as a normal transistor because no channel is formed in the dummy U-shaped unit 13. With this arrangement, even if the photoresist accumulates at the dummy U-shaped unit 13 in the short circuit prevention region H during etching patterns of the first and second electrodes 104 and 105, a short circuit does not occur between the first and second electrodes 104 and 105, that is, a channel short circuit does not occur in the transistor 1.

In some embodiments, in the short circuit prevention region H, the orthographic projection of the first comb handle portion 141 on the active layer 103 is an arc, and a gap between the first comb tooth portion 142 and the second comb tooth portion 143 is the first gap h1 or the second gap h2, and may be formed by using a conventional patterning process. Other structural arrangements of the shift register in this embodiment are the same as those in the above embodiments, and are not described herein again.

Figure 12:
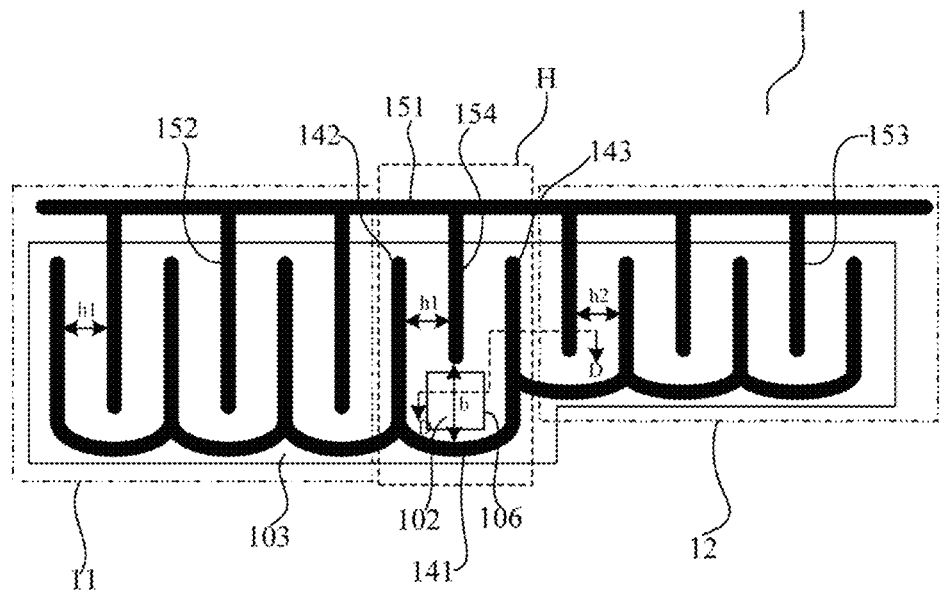
FIG. 12 is a schematic top view of another structure of a transistor in a shift register in an embodiment of the present disclosure.
Figure 13:
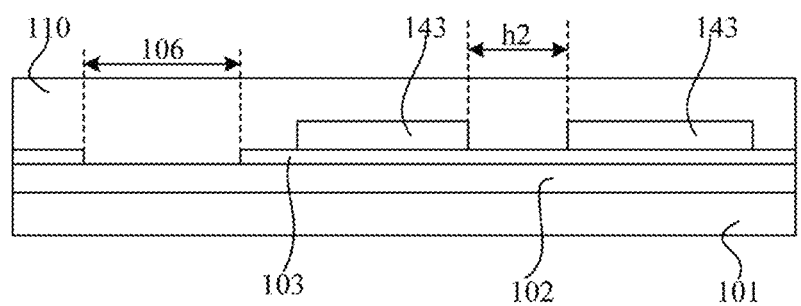
FIG. 13 is a sectional view of a structure taken along a line DD in FIG. 12.

The embodiment of the present disclosure further provides a shift register, which is different from the above embodiment in that, referring to FIGS. 12 and 13, the second electrode 105 further includes a fifth comb tooth portion 154 connected to the second comb handle portion 151; the fifth comb tooth portion 154 is located in the short circuit prevention region H and on a central line parallel to the first comb tooth portion 142 and the second comb tooth portion 143 in the spacing region therebetween; the fifth comb tooth portion 154 is spaced from the first comb handle portion 141 by a fourth gap b; the fourth gap b is greater than the first gap h1, and the fourth gap b is greater than the second gap h2.

When the first and second electrodes 104 and 105 are patterned using a conventional etching process, the photoresist is easily accumulated at a side close to the first comb handle portion 141 in the short circuit prevention region H. Since a length of the comb tooth electrode of the fifth comb tooth portion 154 is smaller than that of the third comb tooth portion 152, an opening 106 is formed in the region of the active layer 103 where an orthographic projection of the fourth gap b overlaps an orthographic projection of the active layer 103, and the active layer 103 in the region where the opening 106 is located loses the function of the channel, so that a channel short circuit is not formed; on the other hand, since a width of the fourth gap b is large, the photoresist does not remain at the fourth gap b, further avoiding the short circuit between the first electrode 104 and the second electrode 105.

Other structural arrangements of the shift register in this embodiment are the same as those in the above embodiments, and are not described herein again.

In the shift register provided in the above embodiment, by defining the short circuit prevention region by the orthographic projections of the first comb tooth portion and the second comb tooth portion of different comb tooth lengths and the first comb handle portion and the second comb handle portion on the active layer, patterns of the first and second comb tooth portions of the first electrode having different lengths and the third and fourth comb tooth portions of the second electrode having different lengths are formed on the active layer through a conventional patterning process, such that it is possible to prevent the photoresist from accumulating in the channel formed between the comb tooth portions of the transistor having different lengths, thereby preventing parts of the film layer forming the patterns of the first and second electrodes within the channel from remaining during the etching process, and further, it is possible to avoid the short circuit between the first electrode and the second electrode in the channel, that is, the channel short circuit, and finally, it is ensured that the signal output of the shift register is normal, and the defects of horizontal striations and the like of a display product adopting the shift register during displaying are avoided.

In a second aspect, an embodiment of the present disclosure provides a gate driving circuit, including a plurality of shift registers in any of the above embodiments; the plurality of shift registers are cascaded.

By adopting the shift register in any embodiment, the area occupied by the gate driving circuit may be reduced, so that the narrow frame or the ultra-narrow frame of the display product adopting the gate driving circuit may be realized, the channel short circuit of the gate driving circuit may be avoided, and the display product adopting the gate driving circuit may be ensured to display normally.

In a third aspect, an embodiment of the present disclosure provides a display panel including the gate driving circuit in the foregoing embodiments.

In some embodiments, the display panel further includes an array substrate; the array substrate includes a display region and a frame region; and the frame region surrounds the periphery of the display region; the gate driving circuits are arranged on the array substrate and respectively positioned in the frame region at two opposite sides of the display region. The gate driving circuits respectively positioned in the frame regions at the two opposite sides of the display region may realize dual-side driving of each row of pixels in the display region, so that the display brightness of the display panel is more uniform, and the display effect is better. Alternatively, the gate driving circuits respectively located in the frame region at the two opposite sides of the display region may also achieve single-side driving of each row of pixels in the display region.

In some embodiments, the gate driving circuits are disposed on the array substrate and located in the frame region at a side of the display region. The gate driving circuits positioned in a frame region at a side of the display region may realize single-side driving of each row of pixels in the display region.

By adopting the gate driving circuit in the embodiment, the frame width of the display panel may be reduced, so that the narrow frame or the ultra-narrow frame of the display panel may be realized, poor display of the display panel caused by the channel short circuit in the gate driving circuit may be avoided, and normal display of the display panel may be ensured.

The display panel provided by the embodiment of the present disclosure may be any product or component with a display function, such as an LCD panel, an LCD television, a monitor, a mobile phone, a navigator and the like.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A shift register, comprising:
at least one transistor;
wherein each of the at least one transistor comprises a gate electrode, a gate insulating layer, an active layer, a first electrode and a second electrode; the first electrode and the second electrode are of comb-shaped structures;
the first electrode comprises first comb tooth portions and second comb tooth portions arranged at intervals, and a first comb handle portion connecting the first comb tooth portions and the second comb tooth portions; and comb tooth electrodes of the first comb tooth portions have a different length from that of comb tooth electrodes of the second comb tooth portions;
the second electrode comprises third comb tooth portions and fourth comb tooth portions arranged at intervals, and a second comb handle portion connecting the third comb tooth portions and the fourth comb tooth portions; and comb tooth electrodes of the third comb tooth portions have a different length from that of comb tooth electrodes of the fourth comb tooth portions;
the first comb tooth portions and the third comb tooth portions form an inter-digital structure, the second comb tooth portions and the fourth comb tooth portions form an inter-digital structure, and orthographic projections of the first comb tooth portions, the third comb tooth portions, the second comb tooth portions and the fourth comb tooth portions on the active layer are not overlapped with each other;
a gap between the comb tooth electrodes of the first comb tooth portion and the third comb tooth portion adjacent to each other is a first gap;
a gap between the comb tooth electrodes of the second comb tooth portion and the fourth comb tooth portion adjacent to each other is a second gap;
a gap between the first comb tooth portion and the second comb tooth portion is a third gap; the third gap is greater than the first gap, and the third gap is greater than the second gap; and
an orthogonal projection of a part of the first comb handle portion on the active layer is one of a diagonal line and an arc.

2. The shift register of claim 1, wherein
a length of each of the comb tooth electrodes of the first comb tooth portions is greater than that of the second comb tooth portions; and
a length of each of comb tooth electrodes of the third comb tooth portions is greater than that of the fourth comb tooth portions.

3. The shift register of claim 2, wherein
the first comb tooth portions comprise a plurality of comb tooth electrodes arranged in parallel and at equal intervals;
the second comb tooth portions comprise a plurality of comb tooth electrodes arranged in parallel and at equal intervals;
the third comb tooth portions comprise a plurality of comb tooth electrodes arranged in parallel and at equal intervals; and
the fourth comb tooth portions comprise a plurality of comb tooth electrodes arranged in parallel and at equal intervals.

4. The shift register of claim 3, wherein
the first comb tooth portions and the third comb tooth portions are staggered to form a first portion having an inter-digital structure, and
the second comb tooth portions and the fourth comb tooth portions are staggered to form a second portion having an inter-digital structure.

5. The shift register of claim 4, wherein the active layer is broken at the third gap.

6. The shift register of claim 5, wherein a part of the active layer at the first portion has a one-piece structure, and a part of the active layer at the second portion has a one-piece structure.

7. The shift register of claim 1, wherein the third gap is greater than or equal to 6 μm.

8. The shift register of claim 1, wherein the first comb tooth portion and the second comb tooth portion are adjacent to each other, and
a gap between the first comb tooth portion and the second comb tooth portion in the short circuit prevention region is the first gap or the second gap.

9. The shift register of claim 1, wherein the second electrode further comprises a fifth comb tooth portion connected to the second comb handle portion; the fifth comb tooth portion is on a central line, parallel to the first comb tooth portion and the second comb tooth portion, of a spacing region between the first comb tooth portion and the second comb tooth portion in the short circuit prevention region;
a gap between the fifth comb tooth portion and the first comb handle portion in the short circuit prevention region is a fourth gap; and
the fourth gap is greater than the first gap, and the fourth gap is greater than the second gap.

10. The shift register of claim 9, wherein an opening is provided in the active layer at a region, an orthographic projection of which overlaps with an orthographic projection of the fourth gap.

11. The shift register of claim 1, wherein the first gap is equal to the second gap.

12. The shift register of claim 1, wherein
the first comb handle portion is connected to any two adjacent comb tooth electrodes of the first comb tooth portions to form a U-shaped unit,
the first comb handle portion is connected to any two adjacent electrodes of the second comb tooth portions to form a U-shaped unit, and
the first electrode comprises a plurality of the U-shaped units connected in series.

13. The shift register of claim 1, wherein
the second comb handle portion is connected to any two adjacent electrodes of the third comb tooth portions to form a U-shaped unit,
the second comb handle portion is connected to any two adjacent electrodes of the fourth comb tooth portions to form a U-shaped unit, and
the second electrode comprises a plurality of the U-shaped units connected in series.

14. The shift register of claim 1, wherein the gate electrode is below the active layer; or
the gate electrode is above the active layer.

15. The shift register of claim 1, wherein
the first electrode is a source electrode, and the second electrode is a drain electrode; or
the first electrode is a drain electrode and the second electrode is a source electrode.

16. The shift register of claim 1, wherein the at least one transistor comprises a plurality of transistors;
the shift register further comprises a first combination comprising two transistors of the plurality of transistors, wherein in the first combination, the gate electrodes of the two transistors are connected with each other, the first electrodes of the two transistors are connected with each other and the second electrodes of the two transistors are connected with each other; and the two transistors in the first combination are arranged to be axisymmetric to each other.

17. The shift register of claim 1, wherein the first gap is not equal to the second gap.

18. A gate driving circuit, comprising a plurality of shift registers, each of which is the shift register of claim 1, wherein the plurality of the shift registers are cascaded.

19. A display panel, comprising the gate driving circuit of claim 18.

20. The display panel of claim 19, further comprising an array substrate, wherein the array substrate comprises a display region and a frame region, and the frame region surrounds a periphery of the display region; and the gate driving circuit is arranged on the array substrate in the frame region at two opposite sides of the display region, respectively.

\* \* \* \* \*